United States Patent [19]
Naito et al.

[11] Patent Number: 6,011,310
[45] Date of Patent: *Jan. 4, 2000

[54] FILM CARRIER AND SEMICONDUCTOR DEVICE USING THE SAME

[75] Inventors: Toshiki Naito; Kazuo Ouchi, both of Osaka, Japan

[73] Assignee: Nitto Denko Corporation, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/722,321

[22] Filed: Sep. 27, 1996

[51] Int. Cl.[7] ............ H01L 23/48; H01L 23/52; H01L 29/40; H01L 23/053

[52] U.S. Cl. ............ 257/774; 257/676; 257/700; 257/737; 438/108

[58] Field of Search ............ 257/676, 698, 257/700, 737, 774; 438/108

[56] References Cited

U.S. PATENT DOCUMENTS

| | | | |
|---|---|---|---|
| 5,382,827 | 1/1995 | Wang et al. | 257/528 |
| 5,468,999 | 11/1995 | Lin et al. | 257/784 |
| 5,521,332 | 5/1996 | Shikata et al. | 174/52.4 |
| 5,530,287 | 6/1996 | Currie et al. | 257/692 |

OTHER PUBLICATIONS

Patent Abstracts of Japan, vol. 018, No. 326 (E–1565), Jun. 21, 1994 & JP 06 077293 A (Nitto Denko Corp), Mar. 18, 1994, *the whole document*.

*Primary Examiner*—Mahshid Saadat
*Assistant Examiner*—Allan R. Wilson
*Attorney, Agent, or Firm*—Sughrue, Mion, Zinn, Macpeak & Seas, PLLC

[57] ABSTRACT

Disclosed are a film carrier comprising an insulating layer having laid therein an electrically conductive circuit such that the circuit is not exposed on the surface thereof, wherein conductive passages from the conductive circuit to one surface of the insulating layer are formed in the insulating layer and via holes from said conductive circuit to the other surface of the insulating layer are formed and a semiconductor device prepared by mounting a semiconductor element on the insulating layer of the film carrier. The film carrier can sufficiently correspond to pitch-fining and high-density mounting of a semiconductor element wiring, can surely perform the connecting operation of inner lead bonding and outer lead bonding and gives the mounting area of as small as possible.

5 Claims, 3 Drawing Sheets

FILM CARRIER AND SEMICONDUCTOR DEVICE USING THE SAME

FIELD OF THE INVENTION

The present invention relates to a film carrier and a semiconductor device using the same.

BACKGROUND OF THE INVENTION

As a method of mounting a semiconductor element, a film carrier system has hitherto been employed and for inner bonding of the leads on the film carrier and the electrodes of a semiconductor element, bumps for connection have been utilized.

Hitherto, as such a bonding method, a method of using a so-called anisotropic electrically conductive film is proposed. Practically, an insulating film in which electrically conductive particles such as the particles of carbon black, graphite, nickel, copper, silver, etc., are dispersed in the oriented state to the thickness direction has been used. However, when the orientation of the dispersed conductive particles is insufficient, the electric connection between the electrode portion of a semiconductor element and the lead portion of a film carrier becomes uncertain, which causes a problem in the point of connection reliability.

On the other hand, a method of forming bumps at the lead side of a film carrier and directly connecting the lead portions to the electrode portion of a semiconductor element is proposed. However, in the method, when wiring of a semiconductor becomes a fine pitch or high density, it becomes difficult to form the wiring or the bumps corresponding to the technique on a film carrier and also the connecting operation must be carried out with the greatest care.

Furthermore, when a film carrier having a wiring circuit and lead portions is used on the surface of a conventional insulating film, usually the area of outer bonding becomes larger than the area of inner bonding, whereby the final mounting area becomes larger than the size (area) of a semiconductor element and thus when hereafter, a small sized device is required, there is a possibility that the foregoing method cannot sufficiently correspond to the requirement.

SUMMARY OF THE INVENTION

The present invention was made for solving the problems in the conventional techniques described above and the object of this invention is to provide a film carrier for a so-called chip-size package, that is a film carrier which can sufficiently correspond to pitch-fining and high-density mounting of a semiconductor element wiring, can surely perform the connecting operation of inner lead bonding and outer lead bonding, and gives the mounting area of as small as possible.

Also, another object of this invention is to provide a semiconductor device wherein a semiconductor element is mounted on the foregoing film carrier.

The inventors have discovered that the foregoing object can be attained by laying a wire in an insulating film such that the circuit is not exposed without forming the circuit on the surface of an insulating film different from a conventional film carrier, exposing on the surface only the end portions of conductive passages connected to the in-land circuit, connecting the end portions to bumps of the electrode portions of a semiconductor element or to the land portions of an outside substrate and have succeeded in accomplishing the present invention based on the discovery.

That is, according to an aspect of the present invention, there is provided a film carrier comprising an insulating layer having laid therein an electrically conductive circuit such that the circuit is not exposed on the surface thereof, wherein conductive passages from the conductive circuit to one surface of the insulating layer are formed in the insulating layer and via holes from said conductive circuit to the other surface of the insulating layer are formed.

Also, according to another aspect of this invention, there is provided a semiconductor device comprising the foregoing film carrier having mounted thereon a semiconductor element such that the electrodes of said semiconductor element are connected to the surface of the insulating layer of the side wherein the via holes of the film carrier are formed.

Figure 1A:
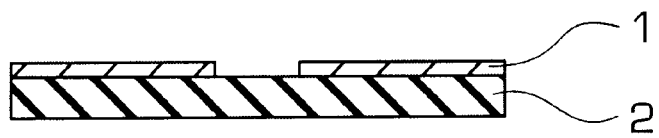
FIGS. 1(A) to 1(E) each is a cross-sectional view showing an example of each production step for obtaining the film carrier of the present invention.

In these figures, each numeral indicates the following:

1 and 1'; an electrically conductive circuit 2, 2', and 2"; an insulating layer 3 and 3'; a via hole 4, 4' and 4"; a conductive passage 5; a semiconductor element 6; an adhesive layer 7; an outside substrate and 8; a land portion.

DETAILED DESCRIPTION OF THE INVENTION

Then, the present invention is practically explained by the following examples by referring to the accompanying drawings.

FIGS. 1(A) to(E) are cross-sectional views showing an example of the production steps for obtaining the film carrier of the present invention.

Figure 1B:
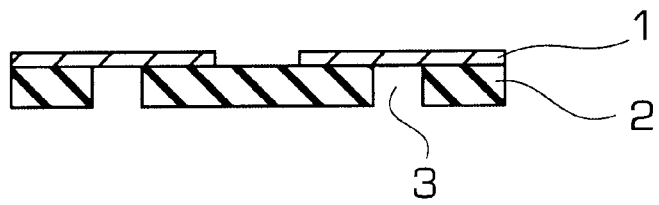

First, after forming an electrically conductive (hereinafter referred referred to simply as conductive) circuit 1 on one surface of an insulating layer 2 by a known method (see, FIG. 1(A)), via holes 3 reaching the conductive circuit 1 are formed in the portions of only the insulating layer 2 where conductive passages should be formed (see, FIG. 1(B)).

Figure 1C:
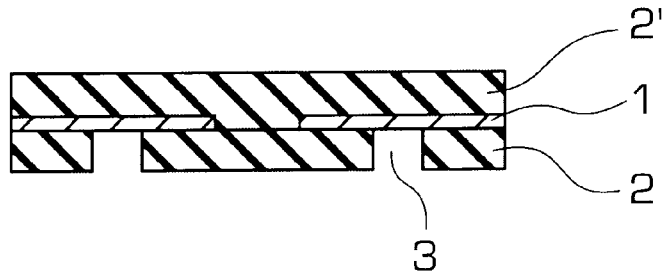
Figure 1D:
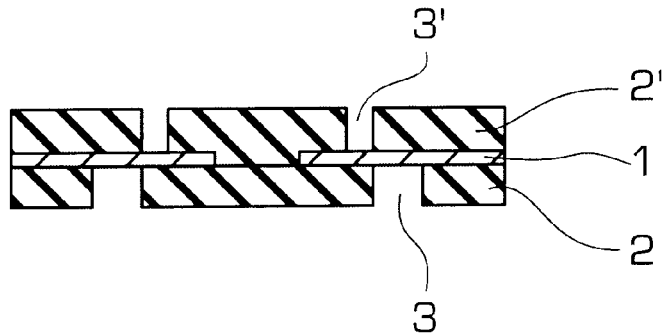

Then, an insulating layer 2' is laminated by heat-press sticking, extrusion molding, cast coating, etc., such that the insulating layer 2' covers the surface of the exposed conductive circuit 1, whereby the conductive circuit 1 becomes a laid state in the insulating layers (see, FIG. 1(C)). Thereafter, via holes 3' are formed in the insulating layer 2' by the same manner as described above (see, FIG. 1(D)).

Finally, an electrically conductive material (hereinafter referred to as conductive material) is added to only fill in the via holes 3 formed in the insulating layer 2 to form conductive passages 4, whereby the film carrier of this invention having the conductive passages at only one side is obtained (see, FIG. 1(E)). In addition, the via holes 3' formed in the insulating layer 2' may be filled by a conductive material electrically connecting the conductive circuit 1 as long as each hole does not reach the surface of the insulating layer 2' (see, FIG. 3).

The foregoing via holes 3 and 3' may be formed after laminating the insulating layers 2 and 2' and also, the conductive material may be added after forming the via hole 3 and also the conductive material may be added after forming the via holes 3'.

The insulating layers 2 and 2' being used for the film carrier of the present invention may be ones substantially having an electrical insulating property and practically thermosetting resins or thermoplastic resins, such as a polyester series resin, an epoxy series resin, a urethane series resin, a polystyrene series resin, a polyethylene series resin, a polyamide series resin, a polyimide series resin, a polycarbonate series resin, a silicone series resin, an acrylonitrile-butadiene-styrene (ABS) copolymer resin, etc., are formed in a layer form. In these insulating resins, the polyimide series resin is preferably used in the points of the heat resistance, the dimensional stability by heating, the mechanical strength, etc.

Also, the thickness of the insulating layer 2 or 2' is generally from 2 to 500 μm, and preferably from about 5 to 150 μm from the points of the mechanical strength and the flexibility. In addition, the insulating layers 2 and 2' may be formed with a same kind of a resin or a different kind of resins.

Also, the feature of the film carrier of the present invention is that the conductive circuit 1 is laid in the insulating layer 2 and the conductive circuit 1 is not exposed to the surface of the layer. As the method of laying the conductive circuit 1 in the insulating layer, it is preferred to conduct the lamination such that the conductive circuit 1 is interposed between the insulating layer 2 and the insulating layer 2' as described above from the point of easiness of the production.

As a method of forming the via holes 3 and 3', there are a mechanical punching method, a photolithographic processing method, a chemical etching processing method, a laser processing method, etc., but for corresponding to fining of pitch, the laser processing which can carry out fine processing is preferable in in particular, it is desirable to use a hole drilling method using an ultraviolet laser having oscillation wavelength in the a ultraviolet region. The via holes thus formed are generally formed at a diameter of from 5 to 200 μm, and preferably from about 8 to 100 μm. Also, by using a photosensitive resin as a material for forming the insulating layers and light-exposing and developing the layers, the fine via holes can be formed.

Furthermore, as a method of filling a conductive material in the via holes 3 and 3', there are a chemical filling method such as a plating method, a chemical vapor deposition (CVD) method, a method of immersing in a molten metal bath to deposit the metal in the holes, etc.; and a physical filling method such as a method of press-injecting the conducting material in the holes, etc., but a method by electroplating using the conductive circuit as the electrode is a simple method and is preferable.

Also, as the conductive material being filled in the via holes, various kinds of metals and alloys such as gold, silver, copper, nickel, cobalt, a solder, etc., or a conductive paste containing a conductive powder dispersed therein, etc., is used. In addition, the conductive passages 4 and 4' thus formed each can be formed not only by a single conductive material but also can be a multilayer structure wherein a relatively inexpensive metal such as copper, etc., is used at the portion being in contact with the conductive circuits 1 and 1' and a metal having a high connection reliability by forming an eutectic is used at end portions of the conductive passages being utilized for connection.

Figure 1E:
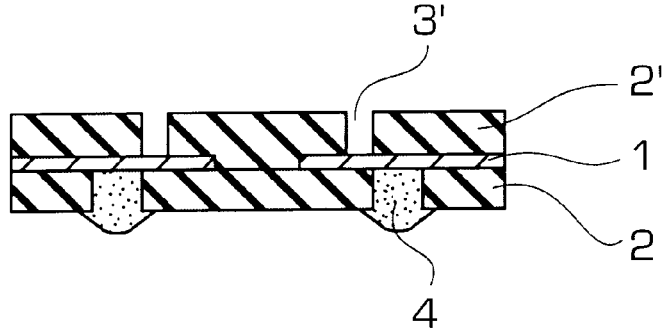

In the film carrier obtained as shown in FIG. 1(E), the end portion of each conductive passage 4 is swelled in a bump form at a height of from about several μm to several tens μm, which is effective for the easiness of determining the positions at connecting the land portion of an outside substrate and the certainty of connection. In addition, when bumps such as solder balls exist at the side to be connected, it is unnecessary to swell the ends of the conductive passages in a bump form as shown in the figure.

Figure 2:
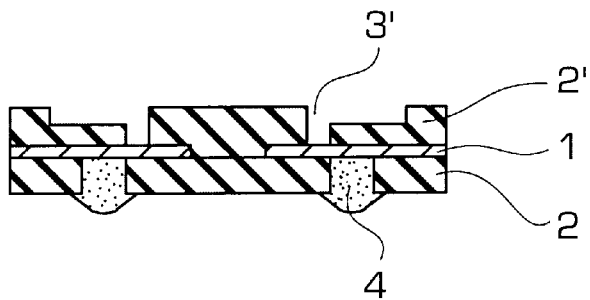
FIG. 2 is a cross-sectional view showing another example of the film carrier of the present invention.

FIG. 2 is a cross-sectional view showing another example of the film carrier of the present invention, wherein the surface of the insulating layer 2' is processed in a recessed portion at the mounting portions thereof. By processing the surface of the insulating layer 2' in the recessed form as described above, at the connection with a semiconductor element, the semiconductor element may only be put in the recessed portion and thus the determination of position and the connecting operation become very simple. Also, when a semiconductor device is prepared by mounting a semiconductor element, the total thickness becomes thin, which is effective for making a thin-type light-weight semiconductor device.

Figure 3:
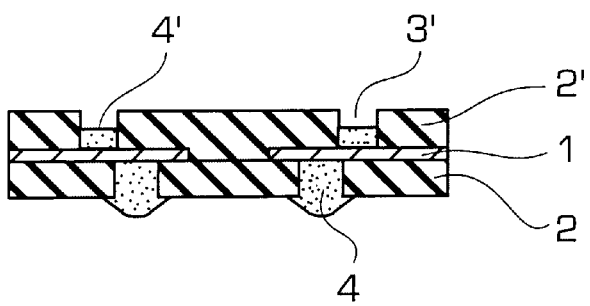
FIG. 3 is a cross-sectional view showing still another example of the film carrier of the present invention.

FIG. 3 is a cross-sectional view showing another example of the film carrier of the present invention, wherein the pitch of the conductive passages 4 (lower side in the figure) of the outer lead bonding portion is narrower than the pitch of the via holes 3' (upper side in the figure) of the inner lead bonding portion. By designing as described above, the size (area) of the film carrier can be reduced as compared with that of conventional film carriers.

Figure 4:
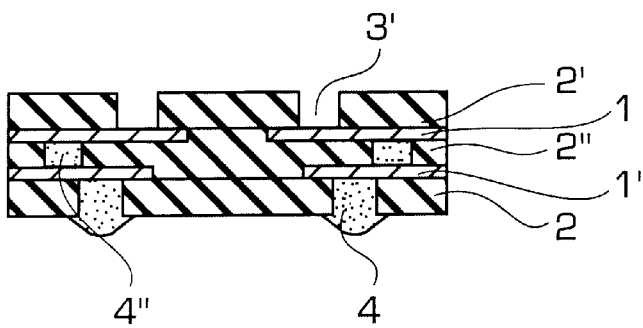
FIG. 4 is a cross-sectional view showing another example of the film carrier of the present invention.

FIG. 4 is a cross-sectional view showing still another example of the film carrier of the present invention, wherein the conductive circuit 1 and the conductive 1', which are laid in insulating layers, are in a multilayer structure. By constituting the conductive circuits 1 and 1' as the multilayer structure in the insulating layers 2, 2', and 2", the degree of freedom in designing of wiring in a semiconductor element is preferably increased as compared with the case that the conductive circuit is a single layer.

Figure 5:
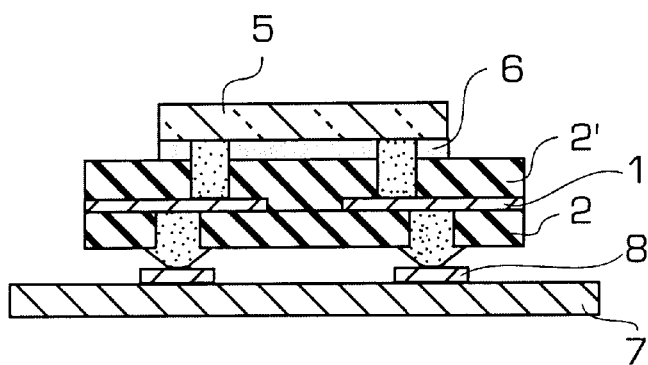
FIG. 5 is a cross sectional view showing an example of the semiconductor device of the present invention.

FIG. 5 is a cross-sectional view showing an example of the semiconductor device of the present invention. In the film carrier obtained in the production steps shown in FIGS. 1(A) to 1(E), a semiconductor element 5 is mounted on the film carrier shown in FIG. 1 such that the electrode portions of the semiconductor element 5 are connected to the via holes 3' of the film carrier shown in FIG. 1(E), and for ensuring the connection, an adhesive layer 6 is disposed between the insulting layer 2' and the semiconductor element 5.

For the adhesive layer 6, an epoxy series resin, a fluorine series resin, a polyimide series resin, etc., can be used and a thermoplastic resin which exhibits adhesive property by hot pressing is preferably used. Also, the adhesive layer 6 may be previously laminated to the semiconductor element side or the film carrier side or a film form adhesive or a ribbon form adhesive can be used by inserting between them and connecting them.

The film carrier thus mounted thereon the semiconductor element 5 is mounted on an outside substrate 7 by connecting the conductive passages 4 at the other side of the film carrier to the land portions 8 on the outside substrate 7.

Figure 6:
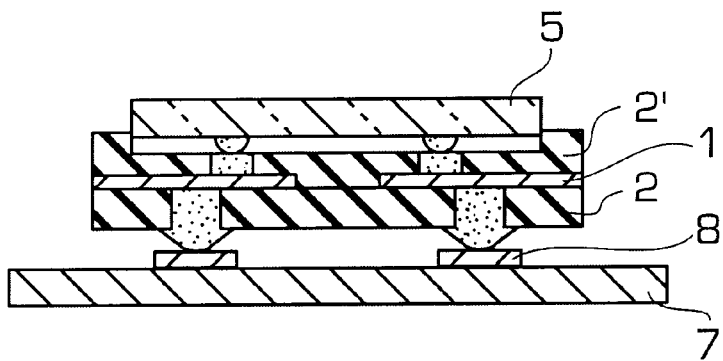
FIG. 6 is a cross sectional view showing other example of the semiconductor device of the present invention.

FIG. 6 is a cross-sectional view showing another example of the semiconductor device of this invention. FIG. 6 shows the state that a semiconductor element 5 is mounted on the film carrier shown in FIG. 2 by connecting the electrode portions of the semiconductor element 5 to the via holes 3' of the film carrier. Because of the presence of a recessed portion which can fit the form of the semiconductor element 5 to he mounted thereon in the surface of the insulating layer 2', the position fitting for mounting the semiconductor 5 can be easily performed by simply placing the semiconductor element 5 in the recessed potion. Furthermore, when a solder is used as the conductive material of the connecting portions, they can be easily connected by only heating, whereby the production step can be simplified.

Figure 7:
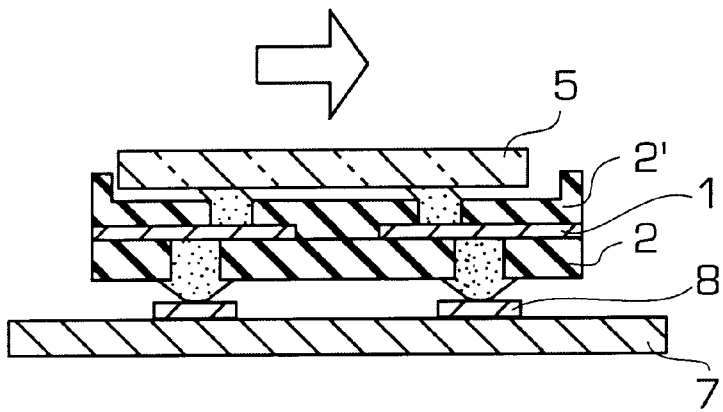
FIG. 7 is a cross-sectional view showing another example of the semiconductor device of the present invention.

FIG. 7 is a cross-sectional view showing another example of the semiconductor device of the present invention, which is a modified example of the semiconductor device shown in FIG. 6. That is, in the case of using a solder bumps, even when the size of the recessed form processed portion of the surface of the insulating layer 2' is larger than the size of a semiconductor element 5 to some extent, a self alignment effect occurs by welding of the solder and the semiconductor element 5 moves to the direction of the arrow as shown in FIG. 7. Accordingly, accurate position fitting becomes unnecessary.

As described above, since in the film carrier of this invention and the semiconductor device of this invention using the film carrier, the conductive circuit is not formed on the surface of an insulating layer but is laid in the inside of the insulating layer, only the end portions of the conductive passages for connecting the land portions of an outside substrate are exposed to the surface of the insulating layer, and the ends of the conductive passages at the connecting side to a semiconductor element are not exposed, the circuit pattern can be freely designed without being influenced by the pattern on the semiconductor element. Furthermore, by forming the conductive circuit in a multilayer structure, a three-dimensional design becomes easy, and the film carrier or semiconductor device of the present invention can sufficiently correspond to fining of pitch.

Also, by forming a recessed portion on the surface of the insulating layer of the film carrier such that it fits the form of a semiconductor element to be mounted on the surface of the insulating layer, settling of the position and the connecting operation becomes very easy and planning of a thin-type semiconductor device becomes possible.

While the invention has been described in detail with reference to specific embodiments, it will be apparent to one skilled in the art that various changes and modifications can be made to the invention without departing from its spirit and scope.

What is claimed is:

1. A film carrier comprising an insulating layer having laid therein an electrically conductive circuit such that the circuit is not exposed on a surface thereof, wherein conductive passages from the conductive circuit to one surface of the insulating layer are formed in the insulating layer and via holes from said conductive circuit to an opposed second surface of the insulating layer are formed; wherein said film carrier does not have conductive material all the way to the surface in the via holes.

2. The film carrier of claim 1, wherein a recessed portion for mounting a semiconductor element is formed on the surface of the insulating layer having formed therein via holes.

3. A semiconductor device comprising a film carrier, said film carrier comprising an insulating layer having laid therein an electrically conductive circuit such that the circuit is not exposed on the surface thereof, wherein conductive passages from the conductive circuit to one surface of the insulating layer and via holes from said conductive circuit to an opposed second surface of the insulating layer are formed, and a semiconductor element mounted on the surface of the insulating layer, wherein electrode portions of the semiconductor element are connected to the via holes of the insulating layer;

wherein said film carrier does not have conductive material all the way to the surface in the via holes.

4. The semiconductor device of claim 3, wherein a recessed portion for mounting a semiconductor element is formed on the surface of the insulating layer having formed therein via holes and at mounting the semiconductor element, the semiconductor element is placed in the recessed portion.

5. A semiconductor device comprising a film carrier, said film carrier comprising an insulating layer having laid therein an electrically conductive circuit such that the circuit is not exposed on the surface thereof, wherein conductive passages from the conductive circuit to one surface of the insulating layer and via holes from said conductive circuit to an opposed second surface of the insulating layer are formed, and a semiconductor element mounted on the surface of the insulating layer, wherein electrode portions of the semiconductor element are connected to the via holes of the insulating layer;

wherein a recessed portion for mounting a semiconductor element is formed on the surface of the insulating layer having formed therein via holes and at mounting the semiconductor element, the semiconductor element is placed in the recessed portion.

* * * * *